United States Patent
Kawata et al.

(10) Patent No.: US 9,659,976 B2
(45) Date of Patent: May 23, 2017

(54) ELECTRO-OPTIC DEVICE AND ELECTRONIC EQUIPMENT

(71) Applicant: Seiko Epson Corporation, Tokyo (JP)

(72) Inventors: Hirotaka Kawata, Suwa (JP); Junichi Taira, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/763,098

(22) PCT Filed: Jan. 15, 2014

(86) PCT No.: PCT/JP2014/000154
§ 371 (c)(1),
(2) Date: Jul. 23, 2015

(87) PCT Pub. No.: WO2014/115507
PCT Pub. Date: Jul. 31, 2014

(65) Prior Publication Data
US 2015/0340386 A1 Nov. 26, 2015

(30) Foreign Application Priority Data
Jan. 25, 2013 (JP) .................................. 2013-011978

(51) Int. Cl.
*H01L 27/12* (2006.01)
*H01L 49/02* (2006.01)
*G02F 1/1362* (2006.01)

(52) U.S. Cl.
CPC .... *H01L 27/1255* (2013.01); *G02F 1/136213* (2013.01); *H01L 28/40* (2013.01); *G02F 2201/52* (2013.01)

(58) Field of Classification Search
CPC ....................................................... H01L 28/40
(Continued)

(56) References Cited

U.S. PATENT DOCUMENTS 6,784,949 B1  8/2004  Nagata et al.
7,230,667 B2  6/2007  Shin et al.
(Continued)

FOREIGN PATENT DOCUMENTS

JP  10-253955 A   9/1998
JP  2000-323698 A  11/2000
(Continued)

OTHER PUBLICATIONS

Search Report received in International Application No. PCT/JP2014/000154; Mar. 25, 2014.

*Primary Examiner* — Douglas Menz
(74) *Attorney, Agent, or Firm* — ALG Intellectual Property, LLC

(57) ABSTRACT

Deterioration of display quality due to a difference of leak current in each pixel is suppressed.

A pixel 30G includes a pixel capacitor 36 and a switching element 14 which controls supplying and blocking of voltage with respect to the pixel capacitor 36, and modulates irradiation light of a first wavelength (530 nm) according to the voltage of the pixel capacitor 36. A pixel 30R includes the pixel capacitor 36 and the switching element 14 that controls supplying and blocking of voltage with respect to the pixel capacitor 36, and modulates irradiation light of a second wavelength (620 nm) which is longer than the first wavelength according to the voltage of the pixel capacitor 36. A capacitance value of the pixel capacitor 36 of the pixel 30G is larger than a capacitance value of the pixel capacitor 36 of the pixel 30R.

7 Claims, 3 Drawing Sheets

(58) Field of Classification Search
USPC .......................................................... 257/71
See application file for complete search history.

(56) References Cited

U.S. PATENT DOCUMENTS

2005/0264720 A1  12/2005  Itou et al.
2006/0215068 A1   9/2006  Nakagawa

FOREIGN PATENT DOCUMENTS

| JP | 2005-338264 A | 12/2005 |
| JP | 2006-276118 A | 10/2006 |
| JP | 2007-047615 A |  2/2007 |
| JP | 2012-189861 A | 10/2012 |
| WO | WO-2012-024249 A |  9/2012 |

ELECTRO-OPTIC DEVICE AND ELECTRONIC EQUIPMENT

TECHNICAL FIELD

The present invention relates to a technology of displaying an image using a plurality of pixels.

BACKGROUND ART

A display apparatus in which a plurality of pixels respectively including a pixel capacitor such as a liquid crystal capacitor and a switching element such as a TFT (Thin Film Transistor) are arranged in a matrix shape has been used in the related art. The switching element is disposed between a data line supplied with gradation voltage according to a display gradation and the pixel capacitor and controls supplying and blocking of the gradation voltage with respect to the pixel capacitor. The pixel capacitor maintains the gradation voltage and displays a gradation according to the gradation voltage. For example, in a projection type display apparatus, irradiation light of a wavelength corresponding to any one of a plurality of display colors (for example, red, green, and blue) is applied to the pixel capacitor of each pixel and is modulated (light amount is controlled) by the pixel capacitor.

CITATION LIST

Patent Literature

PTL 1: JP-A-2006-276118

SUMMARY OF INVENTION

Technical Problem

A part of the irradiation light with respect to each pixel can also reach the switching element of each pixel. Light leak current is generated in the switching element due to light irradiation with respect to the switching element, and a change of voltage maintained in the pixel capacitor is generated. A current amount of the light leak current is different with respect to the switching element according to the wavelength of the irradiation light. Accordingly, a degree of the change of the maintain voltage in the pixel capacitor is different in each display color of each pixel, and as a result, there is a problem in that display quality deteriorates. For example, when the degree of the change of the maintain voltage in the pixel capacitor is different in each display color of each pixel, a degree of generating a flicker is different in each display color so that the display quality deteriorates. Considering the above described condition, the invention is provided with an object of suppressing the deterioration of the display quality due to a difference of the leak current in the switching element of each pixel.

Solution to Problem

In order to solve the above described problems, the present invention provides an electro-optic device comprising a first pixel that includes a first pixel capacitor and a first switching element which controls supplying and blocking of voltage with respect to the first pixel capacitor, and modulates irradiation light of a first wavelength according to voltage of the first pixel capacitor; and a second pixel that includes a second pixel capacitor and a second switching element which controls supplying and blocking of voltage with respect to the second pixel capacitor, and modulates irradiation light of a second wavelength longer than the first wavelength according to voltage of the second pixel capacitor, in which a capacitance value of the first pixel capacitor is greater than a capacitance value of the second pixel capacitor. According to the above described configuration, since the capacitance value of the first pixel capacitor is greater than the capacitance value of the second pixel capacitor, even though the light leak current of the first pixel is larger than that of the second pixel, it is possible that a difference of a change amount of maintain voltage in the first pixel capacitor and the second pixel capacitor becomes reduced. Accordingly, deterioration of display quality due to a difference of the light leak amount between the first pixel and the second pixel can be suppressed.

According to an appropriate aspect of the invention, the electro-optic device further includes a third pixel that includes a third pixel capacitor and a third switching element which controls supplying and blocking of voltage with respect to the third pixel capacitor, and modulates irradiation light of a third wavelength shorter than the first wavelength according to voltage of the third pixel capacitor, in which a capacitance value of the third pixel capacitor is greater than the capacitance value of the first pixel capacitor. According to the above described configuration, a difference of a change amount of voltage in the pixel capacitor of each pixel can be reduced among the first pixel, the second pixel, and the third pixel, and the effect in which the deterioration of the display quality due to a difference of the light leak amount can be suppressed is particularly prominent.

According to an appropriate aspect of the invention, the electro-optic device further includes a third pixel that includes a third pixel capacitor and a third switching element which controls supplying and blocking of voltage with respect to the third pixel capacitor, and modulates irradiation light of the third wavelength shorter than the first wavelength according to voltage of the third pixel capacitor, in which a capacitance value of the third pixel capacitor is the same as the capacitance value of the first pixel capacitor. According to the above described configuration, while reducing a difference of a change amount of voltage in the pixel capacitor of each pixel, it is possible to make a configuration of the pixel capacitor common to the first pixel and the third pixel.

According to an appropriate aspect of the invention, each of the first pixel capacitor and the second pixel capacitor includes a liquid crystal capacitor in which a liquid crystal is interposed between electrodes facing each other and an auxiliary capacitor which is connected to the liquid crystal capacitor in parallel, a capacitance value of the liquid crystal capacitor is common to the first pixel capacitor and the second pixel capacitor, and a capacitance value of the auxiliary capacitor of the first pixel capacitor exceeds the capacitance value of the second pixel capacitor. According to the above described configuration, since the capacitance value of the auxiliary capacitor of the first pixel is different from that of the second pixel, it is possible to make the capacitance value of the liquid crystal capacitor common to the first pixel and the second pixel.

According to an appropriate aspect of the invention, the auxiliary capacitor of each of the first pixel capacitor and the second pixel capacitor includes the first electrode, the second electrode, and a dielectric layer sandwiched between the first electrode and the second electrode, in planar view, the auxiliary capacitor of each of the first pixel capacitor and the second pixel capacitor includes an insulation layer on which an opening portion of which an inner peripheral border is positioned in the inside of peripheral border of the first electrode and the second electrode is formed in each of the first pixel and the second pixel, and a part of peripheries of the opening portion in the insulation layer is sandwiched between the first electrode and the second electrode, and an area of the opening portion corresponding to the first pixel is larger than an area of the opening portion corresponding to the second pixel. According to the above described configuration, by making different an area of the opening portion of the insulation layer of the first pixel from that of the second pixel, it is possible to easily and reliably make the capacitance value of the auxiliary capacitor of the first pixel different from that of the second pixel.

The electro-optic device according to each of the embodiments is adopted in various electronic equipments. For example, the projection type display device which transmits an image to a projection surface by modulating the irradiation light emitted from a light source device in each pixel is assumed as an appropriate example of the electronic equipment according to the invention.

DESCRIPTION OF EMBODIMENTS

<First Embodiment>

Figure 1:
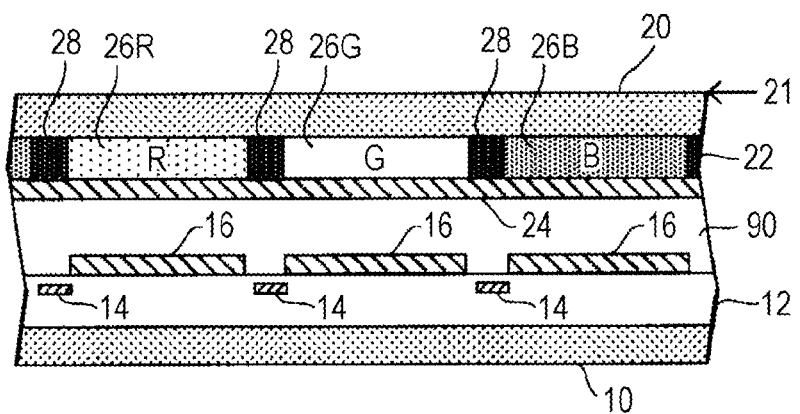
FIG. 1 is a cross-sectional view of an electro-optic device.

FIG. 1 is a cross-sectional view of an electro-optic device 100 of a first embodiment of the invention. The electro-optic device 100 is configured to have a first substrate 10 and a second substrate 20 facing each other with a predetermined interval, and a liquid crystal 90 which is sealed in a space between the first substrate 10 and the second substrate 20. Irradiation light (white light) emitted from a light source device (not illustrated) is incident from a surface 21 of the second substrate 20 to the electro-optic device 100.

The second substrate 20 in FIG. 1 is a light transmissive plate member made of glass, quartz, or the like. A filter layer 22 is formed on a surface of the second substrate 20 on a liquid crystal 90 side, and an opposite electrode 24 is formed on a surface of the filter layer 22. The filter layer 22 is configured to have a plurality of color filters 26 (26R, 26G, and 26B) and a light shielding layer 28. The plurality of color filters 26 corresponds to any one of a plurality of different display colors (red, green, and blue). The color filter 26R corresponding to red selectively transmits light (red light) of a wavelength corresponding to the red (R) among the irradiation light, the color filter 26G selectively transmits light (green light) of a wavelength corresponding to green (G) among the irradiation light, and the color filter 26B selectively transmits light (blue light) of a wavelength corresponding to blue (B) among the irradiation light. The light shielding layer 28 is a film body having light shielding properties (properties of absorbing or reflecting light) which regulate an outer edge of each color filter 26. The opposite electrode 24 is continuously formed throughout the substantially entire surface of the second substrate 20 with a light transmissive conductive material, for example, ITO (Indium Tin Oxide).

The first substrate 10 is a light transmissive plate member made of glass, quartz, or the like. A wiring layer 12 and a plurality of the pixel electrodes 16 are formed on a surface of the first substrate 10 on the liquid crystal 90 side. The wiring layer 12 is a layered part including a plurality of wires (for example, scan line 40 and data line 50 described later) and a plurality of TFTs 14. The plurality of pixel electrodes 16 is formed on a surface of the wiring layer 12 with a light transmissive conductive material, for example, ITO, and is arranged in a matrix shape so as to face each color filter 26 in planar view. Actually, an element such as an oriented film for coating each of the pixel electrodes 16 is also formed; however, for convenience sake, illustrating thereof is omitted in FIG. 1.

Figure 2:
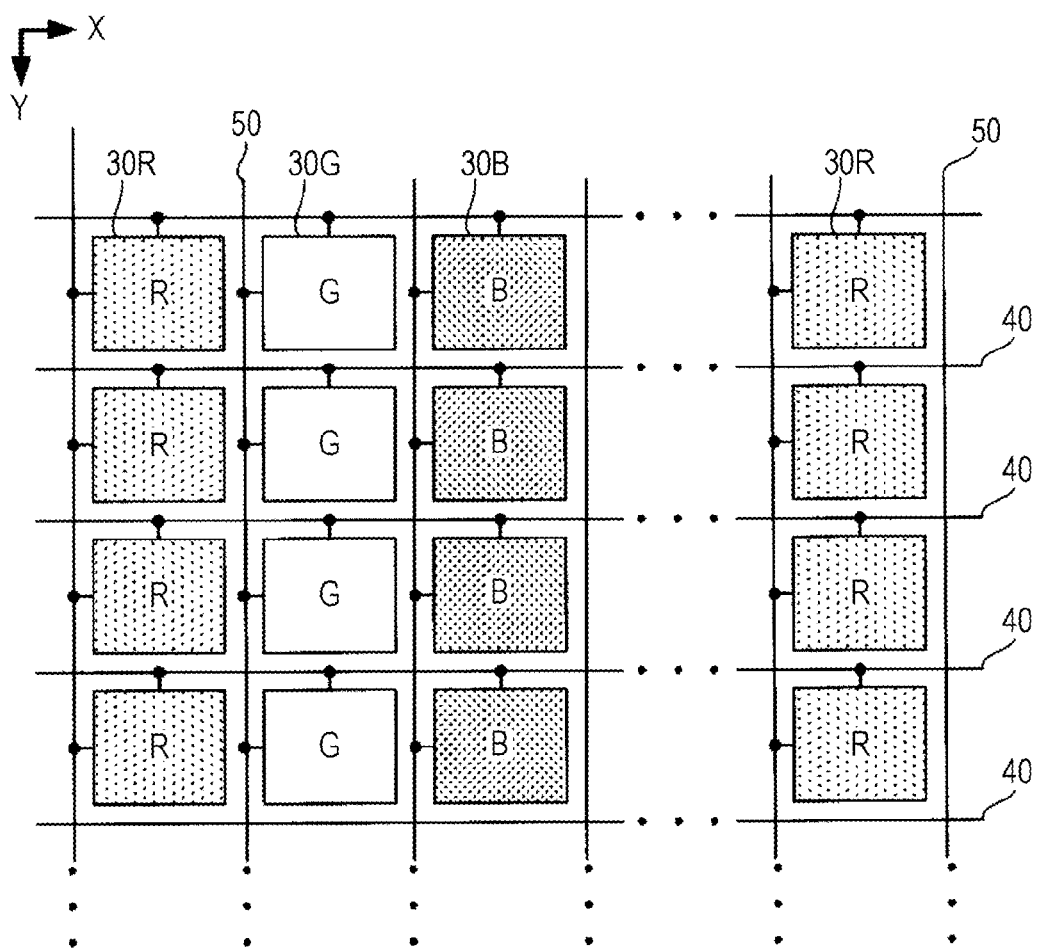
FIG. 2 is an explanatory view of an electronic configuration of the electro-optic device.

FIG. 2 is an explanatory view of an electronic configuration of the electro-optic device 100. As described in FIG. 2, the wiring layer 12 includes a plurality of scan lines 40 extending in an X direction and a plurality of data lines 50 extending in a Y direction intersecting with the X direction. Pixels 30 (30R, 30G, and 30B) are disposed in each intersection between the scan line 40 and the data line 50. As described in FIGS. 1 and 2, each pixel 30 corresponds to any one of a plurality of different display colors. Red light transmitted through the color filter 26R is incident on the pixel 30R corresponding to red. In the same manner, green light is incident on the pixel 30G in green, and blue light is incident on the pixel 30B in blue.

Figure 3:
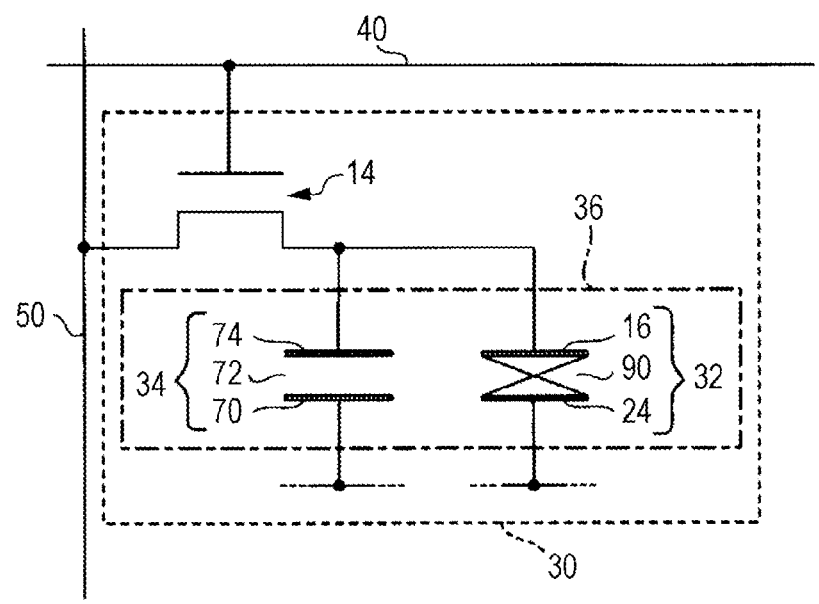
FIG. 3 is a circuit diagram of one pixel.

FIG. 3 is a circuit diagram of each of the pixels 30. As described in FIG. 3, each pixel 30 of the embodiment is configured to have a pixel capacitor 36 and a TFT 14. The pixel capacitor 36 is configured to have a liquid crystal capacitor 32 and an auxiliary capacitor 34. The liquid crystal capacitor 32 is an electrostatic capacitor in which the liquid crystal 90 is sandwiched between the pixel electrode 16 and the opposite electrode 24. The auxiliary capacitor 34 is an electrostatic capacitor in which a dielectric layer 72 is sandwiched between a first electrode 70 and a second electrode 74. As illustrated in FIG. 3, the second electrode 74 of the auxiliary capacitor 34 and the pixel electrode 16 of the liquid crystal capacitor 32 are commonly connected to a drain of the TFT 14. Meanwhile, the first electrode 70 of the auxiliary capacitor 34 and the opposite electrode 24 of the liquid crystal capacitor 32 are electrically connected to a wire which is supplied with a predetermined potential. As described above, the liquid crystal capacitor 32 and the auxiliary capacitor 34 are electrically connected to each other in parallel. Accordingly, a capacitance value of the pixel capacitor 36 is a sum of a capacitance value of the liquid crystal capacitor 32 and a capacitance value of the auxiliary capacitor 34. A phase of the irradiation light reaching the pixel 30 is modulated by a phase difference of the liquid crystal capacitor which is changed according to voltage (voltage between both terminals of the liquid crystal capacitor 32 and the auxiliary capacitor 34) between the pixel electrode 16 and the opposite electrode 24. That is, the pixel 30 functions as an element for modulating (controlling light amount of the irradiation light) the irradiation light according to the voltage maintained in the pixel capacitor 36.

As illustrated in FIG. 3, a source of each TFT 14 in each pixel 30 is connected to the data line 50. That is, the TFT 14 is interposed between the data line 50 and the pixel capacitor 36 and controls an electrical connection (conduction or non-conduction) therebetween. Gradation voltage according to a gradation which is designated by an image signal is supplied to the data line 50. The TFT 14 is controlled according to a scan signal supplied to the scan line 40 to be in an on-state or off-state. When the TFT 14 is controlled to be in the on-state, the gradation voltage supplied to the data line 50 is supplied to the pixel capacitor 36 through the TFT 14 and is maintained in the pixel capacitor 36. On the other hand, when the TFT 14 is controlled to be in the off-state, supplying of the gradation voltage from the data line 50 to the pixel capacitor 36 is stopped. As described above, the TFT 14 functions as a switching element which controls supplying and blocking of the gradation voltage with respect to the pixel capacitor 36.

In the electro-optic device 100 of the embodiment, as illustrated in FIG. 1, in planar view, the light shielding layer 28 is installed in a lattice shape corresponding to each region between the pixel electrodes 16 so as to prevent light from being emitted with respect to the TFT 14 of the pixel 30. However, a part of the irradiation light, for example, is reflected or scattered at a boundary surface, or the like of each element in the wiring layer 12 after being incident on the wiring layer 12 so as to reach the TFT 14. The irradiation light reaching the TFT 14 causes light leak current (leaking of current between drain and source due to the light emission) of the TFT 14 in the off-state.

Figure 4:
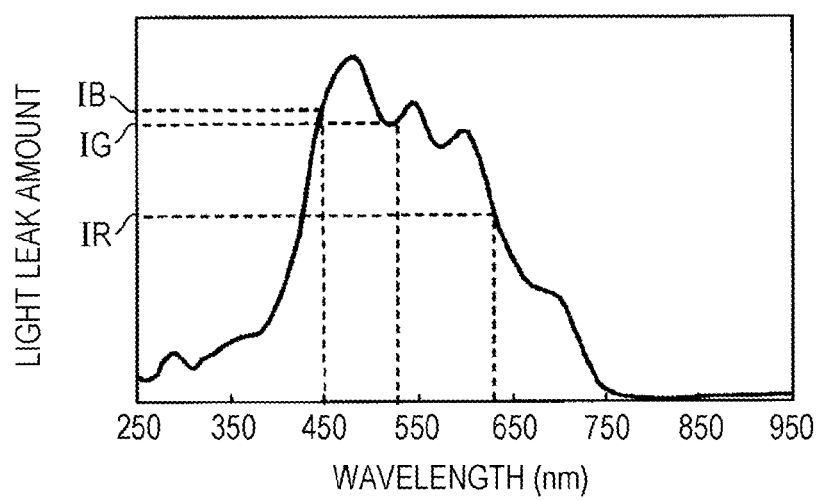
FIG. 4 is a graph illustrating a relationship between a wavelength of light applied to a TFT and a light leak amount.

FIG. 4 is a graph illustrating a relationship between a wavelength of light applied to the TFT 14 of the embodiment and a current amount of the light leak current (hereinafter, referred to as a "light leak amount"). In a range (for example, 450 nm to 620 nm) of the wavelength of the light transmitted through each color filter 26, there is an approximate tendency that the light leak amount of the TFT 14 becomes increased as the wavelength of the irradiation light is short. In the first embodiment, a representative wavelength of the blue light transmitted through the color filter 26B is 450 nm, a representative wavelength of the green light transmitted through the color filter 26G is 530 nm, and a representative wavelength of the red light transmitted through the color filter 26R is 620 nm. As is clear from FIG. 4, the light leak amount IB at the time of applying the blue light exceeds the light leak amount IG at the time of applying the green light, and the light leak amount IG at the time of applying the green light exceeds the light leak amount IR at the time of applying the red light (IB>IG>IR).

In the embodiment, the red light (wavelength thereof is approximately 620 nm) transmitted through the color filter 26R most often reaches the TFT 14 of the pixel 30R. In the same manner, the green light (wavelength thereof is approximately 530 nm) transmitted through the color filter 26G most reaches the TFT 14 of the pixel 30G. The blue light (wavelength thereof is approximately 450 nm) transmitted through the color filter 26B most reaches the TFT 14 of the pixel 30B. Accordingly, there is a tendency that an average of the light leak amount of the TFT 14 of the pixel 30B exceeds an average of the light leak amount of the TFT 14 of the pixel 30G, and an average of the light leak amount of the TFT 14 of the pixel 30G exceeds an average of the light leak amount of the TFT 14 of the pixel 30R.

When the light leak current is generated in the TFT 14, the voltage maintained in the pixel capacitor 36 is reduced as time elapses. As the light leak amount is increased, voltage reduction of the pixel capacitor 36 (for example, reduced amount per a unit of time) becomes large. Accordingly, in a case in which the capacitance value of the pixel capacitor 36 is common to all of the pixels, an imbalance occurs such that the voltage reduction of the pixel 30B exceeds the voltage reduction of the pixel 30G, and the voltage reduction of the pixel 30G exceeds the voltage reduction of the pixel 30R.

Figure 5:
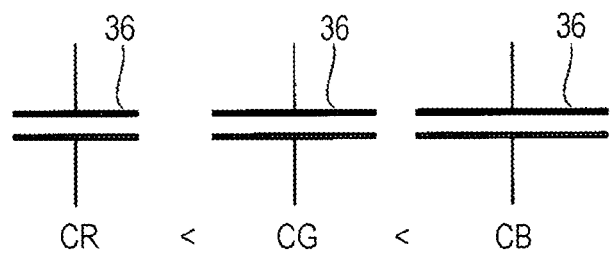
FIG. 5 is a view illustrating a relationship between capacitance values of the pixel capacitors respectively existing in pixels.

In terms of suppressing the imbalance as described above, in the first embodiment, the capacitance value of the pixel capacitor 36 of each pixel 30 according to the light leak amount is selected for each display color. Specifically, as illustrated in FIG. 5, the capacitance value CB of the pixel capacitor 36 of the pixel 30B exceeds the capacitance value CG of the pixel capacitor 36 of the pixel 30G, and the capacitance value CG of the pixel capacitor 36 of the pixel 30G exceeds the capacitance value CR of the pixel capacitor 36 of the pixel 30R (CB>CG>CR). In the first embodiment, the capacitance value of the liquid crystal capacitor 32 is common to display colors of all of the pixels 30. Accordingly, according to the capacitance value of the auxiliary capacitor 34 of each pixel 30, the capacitance value of the pixel capacitor 36 is different in each color. Specifically, the capacitance value cB of the auxiliary capacitor 34 of the pixel 30B exceeds the capacitance value cG of the auxiliary capacitor 34 of the pixel 30G, and the capacitance value cG of the pixel 30G exceeds the capacitance value cR of the auxiliary capacitor 34 of the pixel 30R (cB>cG>cR).

Figure 6:
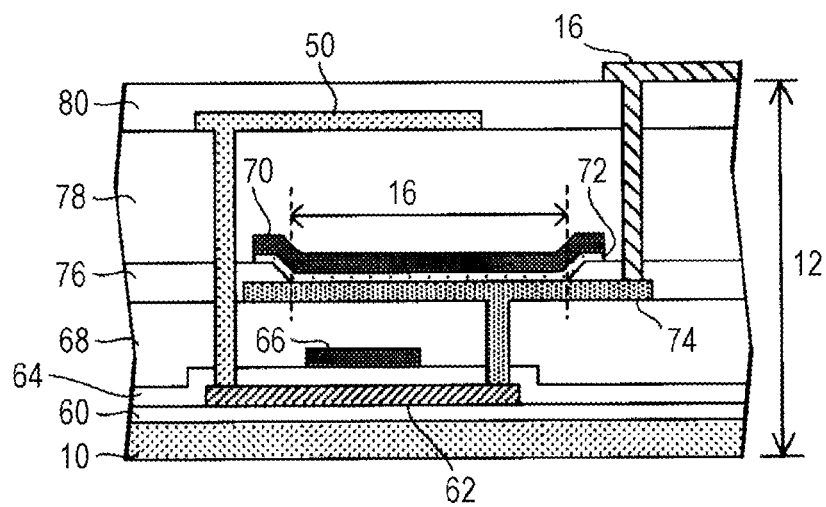
FIG. 6 is a cross-sectional view illustrating a specific configuration of a wiring layer.

FIG. 6 is a cross-sectional view illustrating a specific configuration of the wiring layer 12 by paying attention to one of the pixels 30. The insulation layer 60 in FIG. 6 is formed on the surface of the first substrate 10. The insulation layer 60 on which the semiconductor layer 62 is formed in each pixel 30 is coated with a gate insulation layer 64. On the surface of the gate insulation layer 64, the gate electrode 66 is formed so that the gate insulation layer 64 is sandwiched between the semiconductor layer 62 and the gate electrode 66. The gate electrode 66 is linked to the scan line 40. A part in which the gate insulation layer 64 is interposed between the gate electrode 66 and the semiconductor layer 62 which face each other functions as the TFT 14. The insulation layer 68 is formed throughout the surface of the gate electrode 66 and the surface of the gate insulation layer 64. On the surface of the insulation layer 68, the second electrode 74 is formed in each pixel 30. The second electrode 74 is electrically connected to the semiconductor layer 62 (drain region) through a contact hole which penetrates the insulation layer 68 and the gate insulation layer 64. The dielectric layer 72 is formed on the surface of the second electrode 74. The insulation layer 76 is formed throughout the surface of the second electrode 74 and the surface of the insulation layer 68.

The first electrode 70 is formed with the surface of the dielectric layer 72 in each pixel 30. The auxiliary capacitor 34 is formed on the first electrode 70, the second electrode 74, and the dielectric layer 72.

The opening portion 77 is formed on the insulation layer 76. An inner peripheral border of the opening portion 77 is positioned in the inside of a peripheral border of the second electrode 74 in planar view. Accordingly, a part of the peripheries of the opening portion 77 in the insulation layer 76 is positioned between the first electrode 70 and the second electrode 74. That is, in the region of inside of the opening portion 77, the dielectric layer 72 is only interposed between the first electrode 70 and the second electrode 74, and in the region of outside of the opening portion 77, both of the dielectric layer 72 and the insulation layer 76 are interposed between the first electrode 70 and the second electrode 74. Accordingly, the capacitance value of the auxiliary capacitor 34 depends on an area (an area of a region interposed between the first electrode 70 and the second electrode 74 in the insulation layer 76) of the opening portion 77. Specifically, as the area of the opening portion 77 becomes large, the capacitance value of the auxiliary capacitor 34 becomes large. In the embodiment, as the area of the opening portion 77 of the auxiliary capacitor 34 in the pixel 30B is larger than the area of the opening portion 77 of the auxiliary capacitor 34 in the pixel 30G, the area of the opening portion 77 of the auxiliary capacitor 34 in the pixel 30G becomes larger than the area of the opening portion 77 of the auxiliary capacitor 34 in the pixel 30R.

The insulation layer 78 is formed throughout the surface of the first electrode 70 and the surface of the insulation layer 76. The data line 50 is formed on the surface of the insulation layer 78. The data line 50 is electrically connected to the semiconductor layer 62 (source region) through the contact hole which penetrates the insulation layer 78, the insulation layer 76, the insulation layer 68, and the gate insulation layer 64. The insulation layer 80 is formed throughout the surface of the data line 50 and the surface of the insulation layer 78. The pixel electrode 16 is formed in each pixel 30 on the surface of the insulation layer 80. The pixel electrode 16 is electrically connected to the second electrode 74 through the contact hole which penetrates the insulation layer 80, the insulation layer 78, and the insulation layer 76. That is, the pixel electrode 16 is electrically connected to the semiconductor layer 62 (drain region) through the second electrode 74.

As is clear from the above description, in the embodiment, since the capacitance value of the pixel capacitor 36 of each pixel 30 is selected for each display color of each pixel 30 according to the light leak amount generated in the TFT 14 of the pixel 30, even though the light leak amount is different in the display color of each pixel 30, a difference of a change amount of maintain voltage of the pixel capacitor 36 in each pixel 30 becomes decreased. Accordingly, deterioration of display quality due to a difference of the light leak amount of each display color of each pixel 30 can be suppressed.

<Second Embodiment>

The second embodiment of the invention will be described below. A detailed description of elements having the same operation or function as the first embodiment in each configuration which is exemplified hereinafter will be appropriately omitted using reference numerals referred in the above description.

A luminosity factor of humans with respect to the green light exceeds the luminosity factor with respect to the blue light or the red light. Accordingly, an observer can easily recognize a change of the maintain voltage of the pixel capacitor 36 in the pixel 30G in green compared with a change of the maintain voltage of each pixel 30 in other colors. Considering the above described condition, in the second embodiment, the capacitance value CG of the pixel capacitor 36 of the pixel 30G is secured to be the same as the capacitance value CB of the pixel capacitor 36 of the pixel 30B (CB=CG>CR). As described above, since the capacitance value CB and the capacitance value CG are the same as each other, a structure of the pixel capacitor 36 (an area of the opening portion 77) is common to the pixel 30G and the pixel 30B. Meanwhile, a relationship that the capacitance value CB of the pixel capacitor 36 of the pixel 30B and the capacitance value CG of the pixel capacitor 36 of the pixel 30G exceed the capacitance value CR of the pixel capacitor 36 of the pixel 30R is the same as the first embodiment.

Even in the second embodiment, an effect the same as that of the first embodiment can be obtained. In addition, in the second embodiment, since the pixel 30G in green having a high luminosity factor secures the capacitance value CG which is the same as the capacitance value CB of the pixel 30B, the effect in which the deterioration of the display quality due to the light leak amount can be suppressed is particularly prominent. In addition, there is an advantage that the structure of the pixel capacitor 36 is common to the pixel 30G and the pixel 30B.

<Third Embodiment>

The electro-optic device 100 of a third embodiment includes a pixel 30 in white (hereinafter, a so called "white pixel 30W") in addition to the pixel 30R in red, the pixel 30G in green, and the pixel 30B in blue. For example, a configuration in which the color filter 26 is not formed on a region corresponding to the white pixel 30W in the filter layer 22 or a configuration in which a transparent layer (an element transmitting a wavelength component of all of the irradiation light) is formed on a region corresponding to the white pixel 30W in the filter layer 22 is adopted. The irradiation light having strength higher than those of the pixels 30 in other colors reaches the TFT 14 of white pixel 30W. Accordingly, there is a tendency that the light leak amount becomes larger in the white pixel 30W, compared with the pixel 30 in other colors (30R, 30G, and 30B).

Considering the above tendency, in the third embodiment, the capacitance value CW of the pixel capacitor 36 of the white pixel 30W exceeds the capacitance values of the pixel 30 in other colors (CR, CG, and CB). A relationship that the capacitance value CB exceeds the capacitance value CG, and the capacitance value CG exceeds the capacitance value CR is the same as the first embodiment. (CW>CB>CG>CR). In addition, in the same manner as the first embodiment, the capacitance value of the liquid crystal capacitor 32 is common to the pixels 30 in all of display colors including white. Accordingly, the capacitance value cW of the auxiliary capacitor 34 of the pixel 30W exceeds the capacitance values (cR, cG, and cB) of the auxiliary capacitors 34 of the pixels 30 in other colors (cW>cB>cG>cR).

Even in the third embodiment, an effect the same as that of the first embodiment can be obtained. In addition, a configuration of the second embodiment in which the capacitance value CG of the pixel capacitor 36 of the pixel 30G is the same as the capacitance value CB of the pixel capacitor 36 of the pixel 30B is also applied to the third embodiment.

<Modified Example>

The exemplified embodiments as described above can be variously modified. Specific modified aspects will be exemplified hereinafter. Two or more aspects randomly selected from the below examples can be appropriately combined.

(1) In each of the embodiments described above, the irradiation light is separated as light of each wavelength by the filter layer 22 including the color filter 26; however, a unit for separating the irradiation light into a plurality of colors light having different wavelengths is not limited to the color filter 26. For example, as a technology disclosed in JP-A-10-253955, a volume hologram for separating light by diffracting the light in each color included in the irradiation light at an angle different in each color can be used. Light of each color separated by the volume hologram is focused on a micro lens in each color and applied to the corresponding pixel 30.

(2) Types of the display colors of the pixels 30 are not limited to the examples of embodiments described above. For example, a pixel 30Y modulating yellow light (wavelength thereof is approximately 550 nm) may be included. A color filter 26Y is formed on the filter layer 22 which selectively transmits light of the wavelength corresponding to the yellow light (Y) among the irradiation light. Assuming the above described tendency that the light leak amount of the TFT 14 becomes increased as the wavelength of the irradiation light is short, a configuration is appropriate in which the capacitance value CY of the pixel capacitor 36 of the pixel 30Y is set to a value between the capacitance value CG of the pixel 30G in green and the capacitance value CR of the pixel 30R in red.

(3) In each embodiment as described above, each capacitance value of the liquid crystal capacitor 32 is common to the pixel 30 in each display color; however, the capacitance value of the liquid crystal capacitor 32 may be different in each display color in each pixel 30. Regardless that the capacitance value of the liquid crystal capacitor 32 of each pixel 30 is the same as or different from each other, it is preferable that the sum value (CR, CG, and CB) of each capacitance value of the liquid crystal capacitor 32 of each pixel 30 and the capacitance value of the auxiliary capacitor 34 satisfies a relationship (CB>CG>CR) in each embodiment as described above.

(4) Each element exemplified in the above described embodiment can be appropriately omitted. For example, in each embodiment as described above, the pixel capacitor 36 is configured to have the liquid crystal capacitor 32 and the auxiliary capacitor 34; however, the auxiliary capacitor 34 may be omitted. In addition, the filter layer 22 is installed on the second substrate 20; however, it may be installed on the first substrate 10, and may be separately installed to be omitted from the electro-optic device 100. That is, if the configuration is a configuration in which the color light having different wavelengths from each other reaches the pixel 30 in each display color, any method for generating each color light is adapted.

(5) In each embodiment as described above, in order for the capacitance value C of the pixel capacitor 36 to be different in each display color of each pixel 30, the area of the opening portion 77 of the auxiliary capacitor 34 becomes different in each display color of each pixel 30; however, a configuration for making different the capacitance value of the pixel capacitor 36 in each display color is not limited to the example above described. For example, a configuration in which a thickness of the dielectric layer 72 of the auxiliary capacitor 34 is different in each display color, a configuration in which areas of the first electrode 70 and the second electrode 74 are different in each display color, or a configuration in which the dielectric layer 72 of the pixel 30 is formed of a material having different dielectric constant is considered.

<Application Example>

Figure 7:
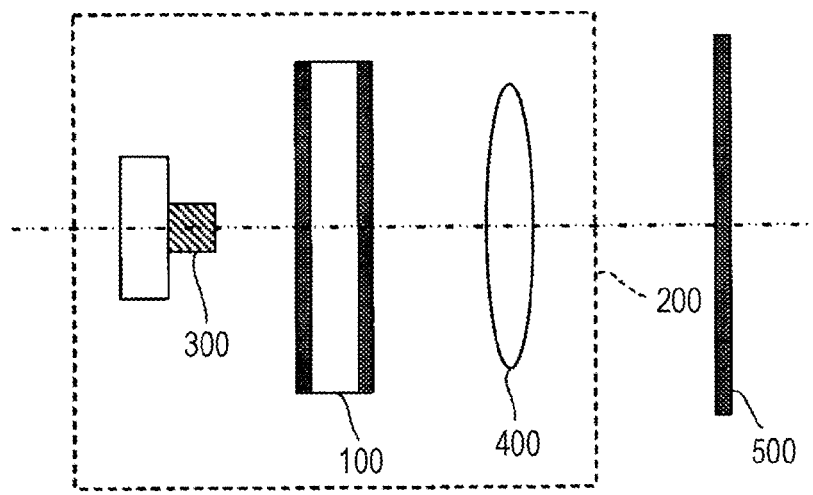
FIG. 7 is a view illustrating each pixel of a projection type display device using the electro-optic device.

The electro-optic device 100 of the above described each embodiment is used in various electronic equipment. FIG. 7 is a diagram illustrating elements of a projection type display device (projector) 200 which uses the electro-optic device 100 of the above described each embodiment. The projection type display device 200 includes a light source device 300, the electro-optic device 100, and a projection optical system 400. The irradiation light emitted from the light source device 300 is modulated by the electro-optic device 100, and the irradiation light after being modulated is applied to a projection surface 500 through the projection optical system 400. In the projection type display device 200, the electro-optic device 100 functions as an element (light valve) for modulating the irradiation light with respect to an image designated by an image signal.

In addition, examples of the electronic equipment to which the electro-optic device according to the invention is applied, in addition to the projection type display device 200 exemplified in FIG. 7, include a personal digital assistant (PDA), a digital still camera, a television, a video camera, a car navigation system, an in-vehicle display (instrument panel), an electronic organizer, electronic paper, a calculator, a word processor, a workstation, a video telephone, a POS terminal, a printer, a scanner, a copier, a video player, a machine including a touch panel, and the like.

This application claims priority to Japan Patent Application No. 2013-011978 filed Jan. 25, 2013, the entire disclosures of which are hereby incorporated by reference in their entireties.

REFERENCE SIGNS LIST

10 SUBSTRATE
12 WIRING LAYER
40 SCAN LINE
50 DATA LINE
60 INSULATION LAYER
62 SEMICONDUCTOR LAYER
64 GATE INSULATION LAYER
66 GATE ELECTRODE
68 INSULATION LAYER
70 FIRST ELECTRODE
72 DIELECTRIC LAYER
74 SECOND ELECTRODE
76 INSULATION LAYER
77 OPENING PORTION
78 INSULATION LAYER
80 INSULATION LAYER
16 PIXEL ELECTRODE
90 LIQUID CRYSTAL
30 (30R, 30G, 30B) PIXEL
14 TFT
36 PIXEL CAPACITOR
32 LIQUID CRYSTAL CAPACITOR
34 AUXILIARY CAPACITOR
20 SUBSTRATE
22 FILTER LAYER
26 (26R, 26G, 26B) COLOR FILTER
28 LIGHT SHIELDING LAYER
24 OPPOSITE ELECTRODE
200 PROJECTION TYPE DISPLAY DEVICE
100 ELECTRO-OPTIC DEVICE
300 LIGHT SOURCE DEVICE
400 PROJECTION OPTICAL SYSTEM
500 PROJECTION SURFACE

The invention claimed is:

1. An electro-optic device comprising:
a first pixel that includes a first pixel capacitor and a first switching element which controls supplying and blocking of voltage with respect to the first pixel capacitor, and modulates irradiation light of a first wavelength according to voltage of the first pixel capacitor; and
a second pixel that includes a second pixel capacitor and a second switching element which controls supplying and blocking of voltage with respect to the second pixel capacitor, and modulates irradiation light of a second wavelength longer than the first wavelength according to voltage of the second pixel capacitor, wherein
the first pixel capacitor includes a first liquid crystal capacitor in which a liquid crystal is interposed between electrodes facing each other, and a first auxiliary capacitor that is connected to the first liquid crystal capacitor in parallel,
the second pixel capacitor includes a second liquid crystal capacitor in which a liquid crystal is interposed between electrodes facing each other, and a second auxiliary capacitor that is connected to the second liquid crystal capacitor in parallel,
the first pixel capacitor has a first capacitance value that is a sum of capacitance values of the first auxiliary capacitor and the first liquid crystal capacitor,
the second pixel capacitor has a second capacitance value that is a sum of capacitance values of the second auxiliary capacitor and the second liquid crystal capacitor, and
the first capacitance value of the first pixel capacitor is greater than the second capacitance value of the second pixel capacitor.

2. The electro-optic device according to claim 1, further comprising:
a third pixel that includes a third pixel capacitor and a third switching element which controls supplying and blocking of voltage with respect to the third pixel capacitor, and modulates irradiation light of a third wavelength shorter than the first wavelength according to voltage of the third pixel capacitor,
wherein
the third pixel capacitor includes a third auxiliary capacitor and a third liquid crystal capacitor,
the third pixel capacitor has a third capacitance value that is a sum of capacitance values of the third auxiliary capacitor and the third liquid crystal capacitor,
the third capacitance value of the third pixel capacitor is greater than the first capacitance value of the first pixel capacitor.

3. The electro-optic device according to claim 1, further comprising:
a third pixel that includes a third pixel capacitor and a third switching element which controls supplying and blocking of voltage with respect to the third pixel capacitor, and modulates irradiation light of a third wavelength shorter than the first wavelength according to voltage of the third pixel capacitor,
wherein
the third pixel capacitor includes a third auxiliary capacitor and a third liquid crystal capacitor,
the third pixel capacitor has a third capacitance value that is a sum of capacitance values of the third auxiliary capacitor and the third liquid crystal capacitor,
the third capacitance value of the third pixel capacitor is the same as the first capacitance value of the first pixel capacitor.

4. The electro-optic device according to claim 1,
wherein a capacitance value of the first liquid crystal capacitor and the second liquid crystal capacitor is common to the first pixel capacitor and the second pixel capacitor, and
wherein a capacitance value of the first auxiliary capacitor of the first pixel capacitor exceeds a capacitance value of the second auxiliary capacitor of the second pixel capacitor.

5. The electro-optic device according to claim 4,
wherein the first auxiliary capacitor and the second auxiliary capacitor of each of the first pixel capacitor and the second pixel capacitor each include a first electrode, a second electrode, and a dielectric layer sandwiched between the first electrode and the second electrode,
wherein, in planar view, the first auxiliary capacitor and the second auxiliary capacitor of each of the first pixel capacitor and the second pixel capacitor each include an insulation layer on which an opening portion of which an inner peripheral border is positioned in the inside of peripheral border of the first electrode and the second electrode is formed in each of the first pixel and the second pixel, and
wherein a part of peripheries of the opening portion in the insulation layer is sandwiched between the first electrode and the second electrode, and an area of the opening portion corresponding to the first pixel is larger than an area of the opening portion corresponding to the second pixel.

6. An electronic equipment comprising the electro-optic device according to claim 1.

7. The electro-optic device according to claim 3, wherein the third capacitance value of the third pixel capacitor is the same as the first capacitance value of the first pixel capacitor, and
the third capacitance value and the first capacitance value are each greater than the second capacitance value.

* * * * *